US005529884A

United States Patent [19]

Tutt et al.

[11] Patent Number: 5,529,884
[45] Date of Patent: Jun. 25, 1996

[54] BACKING LAYER FOR LASER ABLATIVE IMAGING

[75] Inventors: Lee W. Tutt, Webster; Charels C. Anderson; David F. Jennings, both of Penfield; Glenn T. Pearce, Fairport; Richard P. Henzel, Webster, all of N.Y.

[73] Assignee: Eastman Kodak Company, Rochester, N.Y.

[21] Appl. No.: 353,577

[22] Filed: Dec. 9, 1994

[51] Int. Cl.$^6$ .............................. B41M 5/035; G03C 5/16
[52] U.S. Cl. ................ 430/269; 430/270.11; 430/271.1; 430/945; 430/964; 430/200; 430/201; 503/227
[58] Field of Search ....................... 430/269, 270, 430/271, 200, 201, 945, 495, 944, 964; 503/277; 346/135.1, 762

[56] References Cited

U.S. PATENT DOCUMENTS

| | | | |
|---|---|---|---|
| 4,973,572 | 11/1990 | DeBoer | 430/945 |
| 5,156,938 | 10/1992 | Foley et al. | 430/200 |
| 5,171,650 | 12/1992 | Ellis et al. | 430/201 |
| 5,256,506 | 10/1993 | Ellis et al. | 430/20 |
| 5,310,640 | 5/1994 | Markin et al. | 430/527 |
| 5,330,876 | 7/1994 | Kaszczuk et al. | 430/269 |
| 5,330,962 | 7/1994 | De branbandere et al. | 503/227 |
| 5,331,625 | 7/1994 | Mieda et al. | 430/945 |
| 5,336,659 | 8/1994 | Bauer et al. | 503/227 |
| 5,372,985 | 12/1994 | Chang et al. | 503/227 |
| 5,387,496 | 2/1995 | DeBoer | 430/944 |

FOREIGN PATENT DOCUMENTS 1-119934   5/1989   Japan ............... G11B 7/24

OTHER PUBLICATIONS

RD 33483 (Feb. 1992) pp. 155, 157–159.

Primary Examiner—Charles L. Bowers, Jr.
Assistant Examiner—Martin J. Angebranndt
Attorney, Agent, or Firm—Harold E. Cole

[57] ABSTRACT

A laser dye-ablative recording element comprising a support having on one side thereof a dye layer comprising an image dye dispersed in a polymeric binder, the dye layer having an infrared-absorbing material associated therewith to absorb at a given wavelength of the laser used to expose the element, the image dye being substantially transparent in the infrared region of the electromagnetic spectrum and absorbing in the region of from about 300 to about 700 nm and not having substantial absorption at the wavelength of the laser used to expose the element, and the other side of the support having thereon a conductive backing layer of resistivity $<5\times10^{12}$ $\Omega/\square$.

16 Claims, No Drawings

BACKING LAYER FOR LASER ABLATIVE IMAGING

This invention relates to single-sheet, monocolor elements for laser-induced, dye-ablative imaging and, more particularly, to a backing layer for such elements.

In recent years, thermal transfer systems have been developed to obtain prints from pictures which have been generated electronically from a color video camera. According to one way of obtaining such prints, an electronic picture is first subjected to color separation by color filters. The respective color-separated images are then converted into electrical signals. These signals are then operated on to produce cyan, magenta and yellow electrical signals. These signals are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to the cyan, magenta and yellow signals. The process is then repeated for the other two colors. A color hard copy is thus obtained which corresponds to the original picture viewed on a screen. Further details of this process and an apparatus for carrying it out are contained in U.S. Pat. No. 4,621,271, the disclosure of which is hereby incorporated by reference.

Another way to thermally obtain a print using the electronic signals described above is to use a laser instead of a thermal printing head. In such a system, the donor sheet includes a material which strongly absorbs at the wavelength of the laser. When the donor is irradiated, this absorbing material converts light energy to thermal energy and transfers the heat to the dye in the immediate vicinity, thereby heating the dye to its vaporization temperature for transfer to the receiver. The absorbing material may be present in a layer beneath the dye and/or it may be admixed with the dye. The laser beam is modulated by electronic signals which are representative of the shape and color of the original image, so that each dye is heated to cause volatilization only in those areas in which its presence is required on the receiver to reconstruct the color of the original object. Further details of this process are found in GB 2,083,726A, the disclosure of which is hereby incorporated by reference.

In one ablative mode of imaging by the action of a laser beam, an element with a dye layer composition comprising an image dye, an infrared-absorbing material, and a binder coated onto a substrate is imaged from the dye side. The energy provided by the laser drives off the image dye at the spot where the laser beam hits the element and may leave part of the binder behind. In ablative imaging, the laser radiation causes rapid local changes in the imaging layer thereby causing the material to be ejected from the layer. This is distinguishable from other material transfer techniques in that some sort of chemical change (e.g., bond-breaking), rather than a completely physical change (e.g., melting, evaporation or sublimation), causes an almost complete transfer of the image dye rather than a partial transfer. Usefulness of such an ablative element is largely determined by the efficiency at which the imaging dye can be removed on laser exposure. The transmission Dmin value is a quantitative measure of dye clean-out: the lower its value at the recording spot, the more complete is the attained dye removal.

In general, a backing layer on the reverse side of an imaging element may serve a number of important functions which may improve the overall performance of such elements. In particular, it is desirable that such a backing layer should (a) provide adequate conveyance characteristics during manufacture of the element; (b) survive the imaging process intact; (c) adhere well to the support; (d) be free from cracking or undesired blemishes such as abrasion marks as they may be produced during manufacture, storage, or imaging; (e) reduce, or most preferably, eliminate static electricity effects as they may arise during manufacture or imaging of the element; and (f) inhibit undesirable sensitometric effects in the element during manufacture, storage, or imaging.

To meet these requirements by applying a single backing layer to imaging elements has proven to be a difficult challenge for most applications, because the resulting elements should not only exhibit favorable physical properties, but must also survive any processing steps. Since laser-induced dye-ablative imaging elements do not require post-exposure processing steps, i.e., they are regarded as being "processless" elements, the main concern with these imaging elements is that they survive the stress of imagewise exposure and that they possess low absorption for the wavelengths employed.

U.S. Pat. Nos. 5,330,876 and 5,256,506 relate to laser-ablative elements. There is a problem with the elements in these patents in that they are subject to static electricity effects which may arise during manufacture or imaging of the element.

U.S. Pat. No. 5,310,640 relates to a thermally-processable imaging element containing an inner electroconductive layer. However, there is no disclosure in this patent of a laser-ablation element or laser ablation processing.

It is an object of this invention to provide an ablative recording element which has improved electroconductivity to reduce static electricity. It is another object of this invention to provide an ablative single-sheet process which does not require a separate receiving element.

These and other objects are achieved in accordance with this invention which relates to a laser dye-ablative recording element comprising a support having on one side thereof a dye layer comprising an image dye dispersed in a polymeric binder, the dye layer having an infrared-absorbing material associated therewith to absorb at a given wavelength of the laser used to expose the element, the image dye being substantially transparent in the infrared region of the electromagnetic spectrum and absorbing in the region of from about 300 to about 700 nm and not having substantial absorption at the wavelength of the laser used to expose the element, and the other side of the support having thereon a conductive backing layer of resistivity $<5\times10^{12}$ $\Omega/\square$.

In one embodiment of the invention, the conductive backing layer is the outermost layer on the element. In another embodiment of the invention, the conductive backing layer is an inner layer, and an outermost layer is another backing layer.

By use of the invention, the conductive coating on the reverse side of a laser ablative imaging element prevents static buildup and cling of the film, thereby also reducing the tendency to pick up dirt. In the embodiment of the invention where the coating consists of one layer, it is cheaper to apply than multilayer coatings. Further, since the conductive coating is on the surface in that embodiment, less material needs to be used which will lower the overall minimum density.

As noted above, the conductive backing layer used in the present invention is coated on the reverse side, i.e., the side opposite to the side carrying the ablative imaging layer, of a suitable support. The surface resistivity of this conductive layer is less than $5 \times 10^{12}$ $\Omega/\square$, preferably less than $1 \times 10^{11}$ $\Omega/\square$.

A large variety of materials may be used as antistatic agents in such a conductive backing layer and includes such materials as:

(1) electrically conductive metal-containing particles dispersed in the backing layer and/or overcoat layer binder material. Examples of useful electrically conductive metal containing particles include donor-metal oxides, metal oxides containing oxygen deficiencies, and conductive nitrides, carbides, and borides. Specific examples of particularly useful particles include conductive $TiO_2$, $SnO_2$, $V_2O_5$, $Al_2O_3$, $ZrO_2$, $In_2O_3$, ZnO, $TiB_2$, $NbB_2$, $TaB_2$, $CrB_2$, MoB, WB, $LaB_6$, ZrN, TiN, TiC, WC, HfC, HfN, ZrC, $ZnSb_2O_6$ and $InSbO_4$. Examples of the many patents describing these electrically conductive particles and their use in photographic elements include: U.S. Pat. Nos. 4,275,103, 4,394,441, 4,416,963, 4,418,141, 4,431,764, 4,495,276, 4,571,361, 4,999,276, 5,340,676, 5,368,995 and 5,122,445;

(2) semiconductive metal salts, such as cuprous iodide, as described in U.S. Pat. Nos. 3,245,833, 3,428,451, and 5,975,171;

(3) a colloidal gel of vanadium pentoxide or silver-doped vanadium pentoxide as described in U.S. Pat. Nos. 4,203,769, 5,006,451, 5,221,598, 5,284,714, 5,360,706, 5,366,855 and 5,322,761;

(4) fibrous conductive powders comprising, for example, antimony-doped tin oxide coated onto non-conductive potassium titanate whiskers as described in U.S. Pat. Nos. 4,845,369 and 5,116,666;

(5) conductive polymers such as, for example, the crosslinked vinylbenzyl quaternary ammonium polymers of U.S. Pat. No. 4,070,189 or the conductive polyanilines of U.S. Pat. No. 4,237,194; or conductive polythiophenes of EPA 554,588, 564,911 and 593,111; or conductive styrene sulfonate polymers of U.S. Pat. Nos. 4,225,665, 4,960,687, 5,318,878, 5,198,499, 5,096,975 and 5,126,405.

(6) conductive inorganic sols such as those described in EPA 250,154, 334,400 and 531,006.

In a preferred embodiment of the invention, antimony-doped tin oxide particles or silver-doped vanadium pentoxide are used as conductive agents in the conductive backing layer. Typically the mean diameter of these particles is about 200 nm or less, preferably less than 100 nm. The dry coating weight of the conductive particles employed in the conductive layer is less than about 1 $g/m^2$ to insure acceptable optical densities for the coatings.

The conductive backing layer or the additional backing layer may contain other materials useful in such layers such as a polymeric binder, surfactants, colorants, matte materials, lubricants, biocides, cross-linking agents, dispersing aids, coalescing aids, etc.

In another embodiment of the invention, the ablative recording element contains a barrier layer between the support and the dye layer, such as those described and claimed in copending U.S. Ser. No. 099,970 of Topel et al., filed Jul. 30, 1993 and U.S. Ser. No. 259,586 of Pearce et al., filed Jun. 14, 1994, the disclosures of which are hereby incorporated by reference.

Another embodiment of the invention relates to a process of forming a single color, ablation image comprising imagewise exposing by means of a laser, in the absence of a separate receiving element, the ablative recording element described above, the laser exposure taking place through the dye side of the element, and removing the ablated material, such as by means of an airstream, to obtain an image in the ablative recording element.

The invention is especially useful in making reprographic masks which are used in publishing and in the generation of printed circuit boards. The masks are placed over a photosensitive material, such as a printing plate, and exposed to a light source. The photosensitive material usually is activated only by certain wavelengths. For example, the photosensitive material can be a polymer which is crosslinked or hardened upon exposure to ultraviolet or blue light but is not affected by red or green light. For these photosensitive materials, the mask, which is used to block light during exposure, must absorb all wavelengths which activate the photosensitive material in the Dmax regions and absorb little in the Dmin regions. For printing plates, it is therefore important that the mask have high UV Dmax. If it does not do this, the printing plate would not be developable to give regions which take up ink and regions which do not.

As described above, the image dye in the dye ablative recording element is substantially transparent in the infrared region of the electromagnetic spectrum and absorbs in the region of from about 300 to about 700 nm and does not have substantial absorption at the wavelength of the laser used to expose the element. Thus, the image dye is a different material from the infrared-absorbing material used in the element to absorb the infrared radiation and provides visible and/or UV contrast at wavelengths other than the laser recording wavelengths.

Any polymeric material may be used as the binder in the recording element of the invention. For example, there may be used cellulosic derivatives, e.g., cellulose nitrate, cellulose acetate hydrogen phthalate, cellulose acetate, cellulose acetate propionate, cellulose acetate butyrate, cellulose triacetate, a hydroxypropyl cellulose ether, an ethyl cellulose ether, etc., polycarbonates; polyurethanes; polyesters; poly(vinyl acetate); poly(vinyl halides) such as poly (vinyl chloride) and poly (vinyl chloride) copolymers; poly (vinyl ethers); maleic anhydride copolymers; polystyrene; poly(styrene-coacrylonitrile); a polysulfone; a poly(phenylene oxide); a poly(ethylene oxide); a poly(vinyl alcohol-co-acetal) such as poly(vinyl acetal), poly(vinyl alcohol-co-butyral) or poly(vinyl benzal); or mixtures or copolymers thereof. The binder may be used at a coverage of from about 0.1 to about 5 $g/m^2$.

In a preferred embodiment, the polymeric binder used in the recording element of the invention has a polystyrene equivalent molecular weight of at least 100,000 as measured by size exclusion chromatography, as described in U.S. Pat. No. 5,330,876.

To obtain a laser-induced, ablative image using the process of the invention, a diode laser is preferably employed since it offers substantial advantages in terms of its small size, low cost, stability, reliability, ruggedness, and ease of modulation. In practice, before any laser can be used to heat an ablative recording element, the element must contain an infrared-absorbing material, such as pigments like carbon black, or cyanine infrared-absorbing dyes as described in U.S. Pat. No. 4,973,572, or other materials as described in the following U.S. Pat. Nos. 4,948,777, 4,950,640, 4,950,639, 4,948,776, 4,948,778, 4,942,141, 4,952,552, 5,036,040, and 4,912,083, the disclosures of which are hereby incorporated by reference. The laser radiation is then absorbed into the dye layer and converted to heat by a molecular process known as internal conversion. Thus, the construction of a useful dye layer will depend not only on the hue, transferability and intensity of the dye, but also on the ability of the dye layer to absorb the radiation and convert it to heat. The infrared-absorbing material or dye may be contained in the dye layer itself or in a separate layer associated therewith, i.e., above or below the dye layer. As noted above, the laser exposure in the process of the invention takes place through the dye side of the ablative recording element, which enables this process to be a single-sheet process, i.e., a separate receiving element is not required.

Lasers which can be used in the invention are available commercially. There can be employed, for example, Laser Model SDL-2420-H2 from Spectra Diode Labs, or Laser Model SLD 304 V/W from Sony Corp.

Any image dye can be used in the ablative recording element employed in the invention provided it can be ablated by the action of the laser and has the characteristics described above. Especially good results have been obtained with dyes such as anthraquinone dyes, e.g., Sumikaron Violet RS® (product of Sumitomo Chemical Co., Ltd.), Dianix Fast Violet 3R-FS® (product of Mitsubishi Chemical Industries, Ltd.), and Kayalon Polyol Brilliant Blue N-BGM® and KST Black 146® (products of Nippon Kayaku Co., Ltd.); azo dyes such as Kayalon Polyol Brilliant Blue BM®, Kayalon Polyol Dark Blue 2BM®, and KST Black KR® (products of Nippon Kayaku Co., Ltd.), Sumikaron Diazo Black 5G® (product of Sumitomo Chemical Co., Ltd.), and Miktazol Black 5GH® (product of Mitsui Toatsu Chemicals, Inc.); direct dyes such as Direct Dark Green B® (product of Mitsubishi Chemical Industries, Ltd.) and Direct Brown M® and Direct Fast Black D® (products of Nippon Kayaku Co. Ltd.); acid dyes such as Kayanol Milling Cyanine 5R® (product of Nippon Kayaku Co. Ltd.); basic dyes such as Sumiacryl Blue 6G® (product of Sumitomo Chemical Co., Ltd.), and Aizen Malachite Green® (product of Hodogaya Chemical Co., Ltd.);

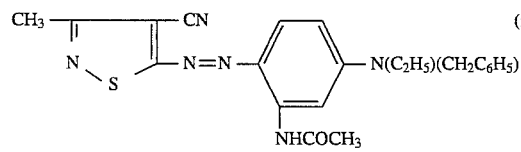 (magenta)

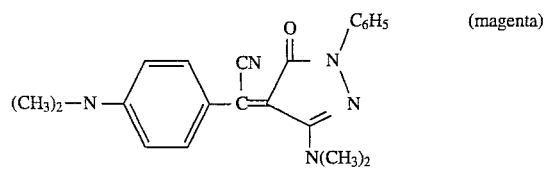 (magenta)

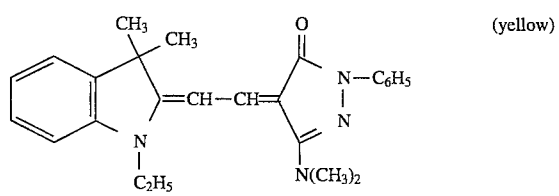 (yellow)

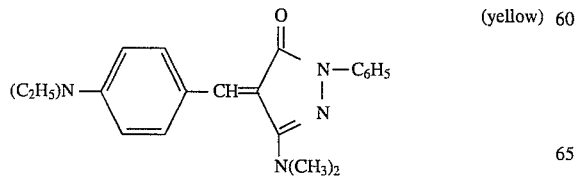 (yellow)

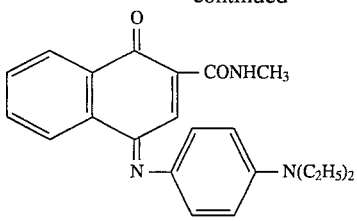 (cyan)

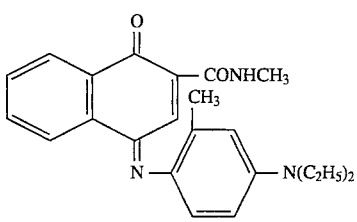 (cyan)

or any of the dyes disclosed in U.S. Pat. Nos. 4,541,830, 4,698,651, 4,695,287, 4,701,439, 4,757,046, 4,743,582, 4,769,360, and 4,753,922, the disclosures of which are hereby incorporated by reference. The above dyes may be employed singly or in combination. The dyes may be used at a coverage of from about 0.05 to about 1 g/m² and are preferably hydrophobic.

The dye layer of the ablative recording element employed in the invention may be coated on the support or printed thereon by a printing technique such as a gravure process.

Any material can be used as the support for the ablative recording element employed in the invention provided it is dimensionally stable and can withstand the heat of the laser. Such materials include polyesters such as poly(ethylene naphthalate); poly(ethylene terephthalate); polyamides; polycarbonates; cellulose esters such as cellulose acetate; fluorine polymers such as poly(vinylidene fluoride) or poly-(tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 200 μm. In a preferred embodiment, the support is transparent.

The following examples are provided to illustrate the invention.

EXAMPLE 1

Single Conductive Backing Layer

Coatings were made having the following compositions:

TABLE 1

| Antistat | Composition | (g/m²) |
|---|---|---|
| A1 | 70/30 polymer | 0.18 |
|  | Sd latex | 0.06 |
|  | Cymel 300 | 0.02 |
|  | Matte | 0.01 |
|  | 10 G Surfactant | 0.01 |
| A2 | Nalco 1115 | 0.19 |
|  | Sd latex | 0.07 |
|  | Matte | 0.01 |
|  | 10 G Surfactant | 0.004 |
| A3 | VB latex | 0.13 |
|  | AVM | 0.13 |
|  | Matte | 0.01 |
|  | 10 G Surfactant | 0.004 |
| A4 | VB latex | 0.17 |
|  | AVM | 0.09 |
|  | Matte | 0.01 |

TABLE 1-continued

| Antistat | Composition | (g/m²) |
|---|---|---|
|  | 10 G Surfactant | 0.004 |
| A5 | tin oxide | 0.11 |
|  | Sd latex | 0.16 |
|  | Matte | 0.01 |
|  | 10 G Surfactant | 0.004 |
| A6 | tin oxide | 0.20 |
|  | gelatin | 0.07 |
|  | DHD | 0.01 |
|  | Matte | 0.01 |
|  | Saponin | 0.004 |
| A7 | tin oxide | 0.17 |
|  | gelatin | 0.05 |
|  | DHD | 0.001 |
|  | Sd latex | 0.05 |
|  | Matte | 0.01 |
|  | Saponin | 0.004 |

KEY:
VB latex = crosslinked vinylbenzyl chloride latex that has been quaternized with $(C_2H_5)_3N$
Sd latex 15/83/02 = methyl acrylate/vinylidene chloride/itaconic terpolymer latex
AVM = acrylonitrile/vinylidene chloride/trimethylammonium ethyl methacrylate methosulfate
DHD = 2,3-dihydroxy-1,4-dioxane
70/30 polymer = copolymer of sodium salt of styrene-sulfonic acid and hydroxyethyl methacrylate (70:30)
Cymel 300 = hexamethylmelamine (American Cyanamid CO.)
Nalco 1115 = 4 nm diameter colloidal silica (sodium stabilized)
tin oxide = 20 nm average diameter, antimony-doped CPM 375 (Keeling and Walker, Ltd.), media-milled to the desired particle size
Matte = poly(methyl methacrylate) beads, 3–4 μm diameter
10 G Surfactant = a polyglycidol surfactant from Olin Corp.

The above compositions were coated on a 100 μm poly(ethylene terephthalate) film support. Each element had an image layer applied on the reverse side of the support as described above. A control C-1 was also coated which did not have any backing layer. The image layer composition was as follows:

0.60 g/m² 1000–1500 s nitrocellulose binder (Aqualon Corp.)

0.13 g/m² liquid UV-absorbing dye 0.24 g/m² yellow dye 0.16 g/m² cyan dye 0.20 g/m² infrared-absorbing dye wherein the cited dyes have the following structures:

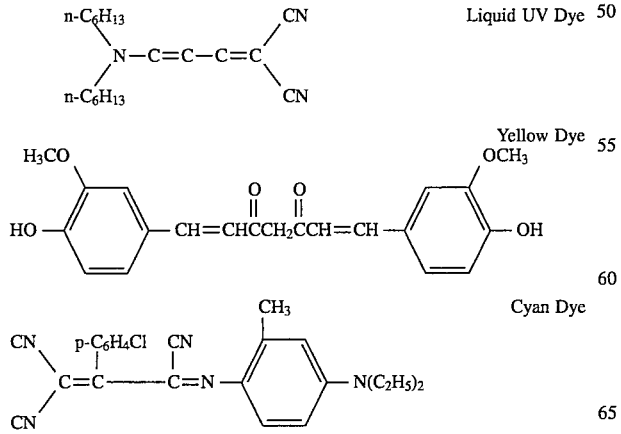

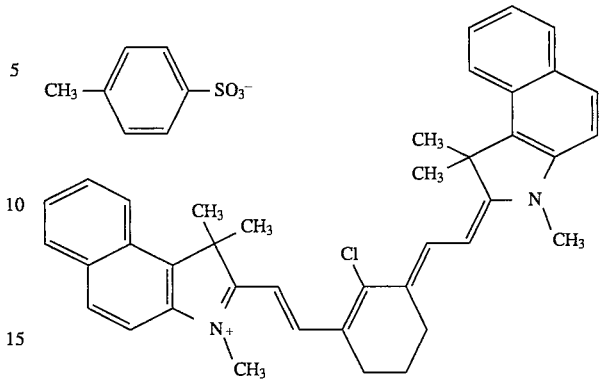

The elements were imaged by securing each one to the drum of a diode laser imaging device as described in U.S. Pat. No. 4,876,235 with the recording layer facing outwards. The laser imaging device consisted of diode lasers connected to a lens assembly mounted on a translation stage and focused onto the surface of the laser ablative recording element. The diode lasers employed were Spectra Diode Labs No. SDL-2432 having an integral, attached optical fiber for the output of the laser beam with a wavelength range 800–830 nm and a nominal power output of 250 milliwatts at the end of the optical fiber. The cleaved face of the optical fiber (50 μm core diameter) was imaged onto the plane of the dye-ablative element with a 0.5 magnification lens assembly mounted on a translation stage giving a nominal spot size of 25 μm.

The drum, 52.7 cm in circumference, was rotated at a speed of 200 rpm and the imaging electronics were activated to provide exposures at 566 mJ/cm². The translation stage was incrementally advanced across the dye-ablative element by means of a lead screw turned by a microstepping motor, to give a center-to-center line distance of 10 μm (945 lines per centimeter, or 2400 lines per inch). An airstream was bloom over the donor surface to remove the sublimed dye. The measured average total power at the focal plane was 100 mW.

For each sample, the surface resistivities were determined in both the Dmax and Dmin areas at 20% RH using a two-point probe as described in co-pending application U.S. Ser. No. 228,836 of Melpolder, et al., filed Apr. 18, 1994. The UV Dmin and UV Dmax values shown in the Table below were determined using an X-Rite densitometer Model 361T (X-Rite Corp., Grandville, Mich.).

A summary of all significant data is shown below.

TABLE 2

| Antistat Coating | UV Dmax | UV Dmin | Res. Dmax Area Ω/□ | Res. Dmin Area Ω/□ |
|---|---|---|---|---|
| C1 | 2.7 | 0.31 | >1.0 × 10¹⁴ | >1.0 × 10¹⁴ |
| A1 | 2.7 | 0.32 | 1.6 × 10¹¹ | 7.9 × 10¹⁰ |
| A2 | 2.6 | 0.32 | 1.3 × 10¹¹ | 1.0 × 10¹² |
| A3 | 2.7 | 0.31 | 5.0 × 10⁸ | 5.0 × 10⁸ |
| A4 | 2.7 | 0.31 | 2.5 × 10⁸ | 1.3 × 10⁸ |
| A5 | 2.8 | 0.32 | 4.0 × 10⁹ | 6.3 × 10⁹ |
| A6 | 2.9 | 0.33 | 1.0 × 10⁹ | 4.0 × 10⁹ |
| A7 | 3.0 | 0.34 | 6.3 × 10⁸ | 3.2 × 10⁸ |

The above data show that the antistat coatings are significantly more conductive than the control and are not substantially modified by the ablation process. It is also shown that there is no substantial difference in the UV absorption Dmin, indicating that the absorption contribution of the film is insignificant.

EXAMPLE 2

Two Backing Layers

This experiment was run to show the advantages provided by a two-layer antistat system for laser-ablative elements. In this case, the innermost or buried antistat layer would obviously be abrasion-resistant. Moreover, a two-layer system would result in less stringent specifications for the antistat materials which could be used. Such a two-layer system has the advantage that the outermost layer can be optimized with respect to abrasion resistance and surface features, whereas the buried layer can be separately optimized for conductive antistat properties.

The following tests were run to show that two-layer antistat systems would also work for laser-ablative imaging elements. The following compositions were coated on (poly(ethylene terephthalate)) film support:

TABLE 3

| Test Sample | Antistat (buried) layer (g/m²) | Outermost layer (g/m²) |
|---|---|---|
| B-1 | 0.053 gelatin | 0.151 gelatin |
|  | 0.0044 Nipacide | 0.151 terpolymer 2 |
|  | 0.0009 chrome alum | 0.013 beads (3–4 μm) |
|  | 0.0016 Saponin | 0.009 DHD |
|  | 0.0033 beads (1.3 μm) | 0.0022 S1 |
|  | 0.301 tin oxide | 0.0022 S2 |
|  | (doped with 6%-wt Sb) |  |
| B-2 | 0.053 gelatin | 0.466 gelatin |
|  | 0.0044 Nipacide | 0.093 terpolymer 2 |
|  | 0.0009 chrome alum | 0.018 beads (3–4 μm) |
|  | 0.0016 Saponin | 0.017 DHD |
|  | 0.0033 beads (1.3 μm) | 0.0022 S1 |
|  | 0.301 tin oxide | 0.0022 S2 |
|  | (doped with 6%-wt Sb) |  |
| B-3 | 0.0025 S2 | 0.43 gelatin |
|  | 0.0029 terpolymer 1 | 0.013 beads (3–4 μm) |
|  | 0.0026 V₂O₅ | 0.0023 Saponin |
|  |  | 0.0086 DHD |
| B-4 | 0.0025 S2 | 0.30 gelatin |
|  | 0.0029 terpolymer 1 | 0.018 beads (3–4 μm) |
|  | 0.0026 V₂O₅ | 0.0023 Saponin |
|  |  | 0.0060 DHD |
| B-5 | 0.0026 V₂O₅ | 0.43 gelatin |
|  | 0.0029 terpolymer 1 | 0.018 beads (3–4 μm) |
|  | 0.0024 S2 | 0.026 S1 |
|  |  | 0.026 S2 |
| B-6 | 0.0026 V₂O₅ | 0.43 gelatin |
|  | 0.0029 terpolymer 1 | 0.22 terpolymer 2 |
|  | 0.0024 S2 | 0.011 beads (5.5 μm) |
|  |  | 0.022 Syloid 72 |
|  |  | 0.036 S1 |
|  |  | 0.036 S2 |
| B-7 | 0.0013 V₂O₅ | 1.08 Elvacite 2041 |
|  | 0.0029 terpolymer 1 | 0.0054 copolymer |
|  | 0.0025 S2 | beads (9 μm) |

Key:
terpolymer 1: poly(acrylonitrile-co-vinylidene chloride-co-acrylic acid)
terpolymer 2: poly(butyl-co-2-methyl-2-[1-oxo-2-propenyl)amino]-1-propanesulfonic acid-co-[(2-methyl-1-oxo-2-propenyl)-oxy]ethyl-3-oxo-butanoic acid)
beads: poly(methyl methacrylate) beads
copolymer beads: poly(methyl methacrylate-co-divinylbenzene) beads (97:3)
S1: Na tert-octylphenoxy-di-ethoxy-ethanesulfonate
S2: 10 G surfactant (Olin Corp.)
Nipacide: 4-chloro-3,5-dimethylphenol (Nipa Labs., Lancashire, UK)
Syloid 72: amorphous silica particles, averagesize 7 μm (W. R. Grace Co.)
DHD: 2,3-dihydroxy-1,4-dioxane
Elvacite 2041: a methyl methacrylate homopolymer available from DuPont An image layer was applied to the reverse side of each of these test samples and testing was performed as in Example 1. The image media were tested in both the ablated and unablated regions by a "wet electrode resistivity" test (WER) as described by R. A. Elder, "Resistivity Measurements on Buried Conductive Layers", 1990 EOS/ESD Symposium Proceedings, pages 251–254. This test was used because measurement of surface resistance would not adequately reflect the conductivity of a buried layer in a multilayer system.

The WER test was conducted by first allowing the films to reach equilibrium in a 50% RH environment. The resistance of a 15.24 by 2.54 cm (6 by 1 inch) test sample strip, which was dipped with both of its ends 1.9 cm deep into a saturated salt solution, was measured. The following results were obtained:

TABLE 4

| Test Sample | unablated WER $\Omega/\square$ | ablated WER $\Omega/\square$ |
|---|---|---|
| bare support | >3 × 10³ | >3 × 10¹³ |
| B-1 | 7.9 × 10¹⁰ | 1.2 × 10¹¹ |
| B-2 | 6.3 × 10¹⁰ | 7.9 × 10¹⁰ |
| B-3 | 6.3 × 10⁸ | 2.5 × 10⁹ |
| B-4 | 5.0 × 10⁸ | 1.2 × 10¹⁰ |
| B-5 | 1 × 10¹⁰ | 7.9 × 10⁹ |
| B-6 | 7.9 × 10⁹ | 1 × 10¹⁰ |
| B-7 | 1.6 × 10⁹ | 1.4 × 10⁹ |

The above data show that a two-layer antistat system can provide adequate protection by providing a conductive layer which is not significantly degraded during the ablation process.

The invention has been described in detail with particular reference to preferred embodiments thereof, but it will be understood that variations and modifications can be effected within the spirit and scope of the invention.

What is claimed is:

1. A dye-ablative recording element capable of being imagewise-exposed by means of a laser comprising a support having on one side thereof a dye layer comprising an image dye dispersed in a polymeric binder, said dye layer having an infrared-absorbing material associated therewith to absorb at a given wavelength of the laser used to expose said element, said image dye absorbing in the region of the electromagnetic spectrum of from about 300 to about 700 nm and not having substantial absorption at the wavelength of said laser used to expose said element, and the other side of said support having thereon a conductive backing layer of resistivity <5×10¹² $\Omega/\square$, said conductive backing layer containing a matte material.

2. The element of claim 1 wherein said conductive backing layer has a resistivity of less than 1×10¹¹ $\Omega/\square$.

3. The element of claim 1 wherein said conductive backing layer is the outermost layer on said support.

4. A dye-ablative recording element capable of being imagewise-exposed by means of a laser comprising a support having on one side thereof a dye layer comprising an image dye dispersed in a polymeric binder, said dye layer having an infrared-absorbing material associated therewith to absorb at a given wavelength of the laser used to expose said element, said image dye absorbing in the region of the electromagnetic spectrum of from about 300 to about 700 nm and not having substantial absorption at the wavelength of said laser used to expose said element, and the other side of said support having thereon a conductive backing layer of resistivity <5×10¹² $\Omega/\square$, said conductive backing layer being overcoated with a second backing layer.

5. The element of claim 4 wherein said second backing layer contains a matte material.

6. The element of claim 1 wherein said infrared-absorbing material is a dye which is contained in said dye layer.

7. The element of claim 1 wherein said support is transparent.

8. The element of claim 1 wherein a barrier layer is present between said support and said dye layer.

9. A process of forming a single color, ablation image comprising imagewise exposing by means of a laser, in the absence of a separate receiving element, a dye-ablative recording element comprising a support having on one side thereof a dye layer comprising an image dye dispersed in a polymeric binder, said dye layer having an infrared-absorbing material associated therewith to absorb at a given wavelength of the laser used to expose said element, said image dye absorbing in the region of the electromagnetic spectrum of from about 300 to about 700 nm and not having substantial absorption at the wavelength of said laser used to expose said element, and the other side of said support having thereon a conductive backing layer of resistivity $<5\times10^{12}$ $\Omega/\square$, said conductive backing layer containing a matte material, said laser exposure taking place through the dye side of said element, and removing the ablated material by means of an air stream to obtain an image in said ablative recording element.

10. The process of claim 9 wherein said conductive backing layer has a resistivity of less than $1\times10^{11}$ $\Omega/\square$.

11. The process of claim 9 wherein said conductive backing layer is the outermost layer on said support.

12. A process of forming a single color, ablation image comprising imagewise exposing by means of a laser, in the absence of a separate receiving element, a dye-ablative recording element comprising a support having on one side thereof a dye layer comprising an image dye dispersed in a polymeric binder, said dye layer having an infrared-absorbing material associated therewith to absorb at a given wavelength of the laser used to expose said element, said image dye absorbing in the region of the electromagnetic spectrum of from about 300 to about 700 nm and not having substantial absorption at the wavelength of said laser used to expose said element, and the other side of said support having thereon a conductive backing layer of resistivity $<5\times10^{12}$ $\Omega/\square$, said conductive backing layer being overcoated with a second backing layer, said laser exposure taking place through the dye side of said element, and removing the ablated material to obtain an image in said ablative recording element.

13. The process of claim 12 wherein said second backing layer contains a matte material.

14. The process of claim 9 wherein said infrared-absorbing material is a dye which is contained in said dye layer.

15. The process of claim 9 wherein said support is transparent.

16. The process of claim 9 wherein a barrier layer is present between said support and said dye layer.

\* \* \* \* \*